United States Patent
Huang et al.

(10) Patent No.: US 8,501,567 B2
(45) Date of Patent: Aug. 6, 2013

(54) MANUFACTURING METHOD OF HIGH VOLTAGE DEVICE

(75) Inventors: Tsung-Yi Huang, Hsinchu (TW); Yuh-Chyuan Wang, Zhubei (TW)

(73) Assignee: Richtek Technology Corporation, R.O.C., Chupei, Hsin-Chu (TW)

( * ) Notice: Subject to any disclaimer, the term of this patent is extended or adjusted under 35 U.S.C. 154(b) by 17 days.

(21) Appl. No.: 13/317,568

(22) Filed: Oct. 21, 2011

(65) Prior Publication Data
US 2013/0045577 A1    Feb. 21, 2013

(30) Foreign Application Priority Data
Aug. 16, 2011 (TW) .............................. 100129265 A

(51) Int. Cl.
*H01L 21/8234* (2006.01)
(52) U.S. Cl.
USPC ..... 438/275; 438/227; 438/526; 257/E21.632

(58) Field of Classification Search
USPC ................. 438/199, 275, 297, 301, 303, 227, 438/526; 257/E21.632
See application file for complete search history.

(56) References Cited

U.S. PATENT DOCUMENTS

| 2006/0006462 A1* | 1/2006 | Chang et al. .................. 257/341 |
| 2007/0132033 A1* | 6/2007 | Wu et al. ....................... 257/371 |

\* cited by examiner

*Primary Examiner* — Thanhha Pham
(74) *Attorney, Agent, or Firm* — Tung & Associates

(57) ABSTRACT

The present invention discloses a manufacturing method of a high voltage device. The high voltage device is formed in a first conductive type substrate. The high-voltage device includes: a second conductive type buried layer; a first conductive type high voltage well; and a second conductive type body. The high voltage well is formed by the same step for forming a first conductive type well or a first conductive type channel stop layer of a low voltage device formed in the same substrate. The body is formed by the same step for forming a second conductive type well of the low voltage device.

11 Claims, 3 Drawing Sheets

MANUFACTURING METHOD OF HIGH VOLTAGE DEVICE

CROSS REFERENCE

The present invention claims priority to TW 100129265, filed on Aug. 16, 2011.

BACKGROUND OF THE INVENTION

1. Field of Invention

The present invention relates to a manufacturing method of a high voltage device; particularly, it relates to such manufacturing method which manufactures the high voltage device by process steps compatible to a low voltage device manufacturing process.

2. Description of Related Art

FIG. 1 shows a cross-section view of a prior art double diffused metal oxide semiconductor (DMOS) device. As shown in FIG. 1, a P-type substrate 11 has multiple isolation regions 12 by which a device region 100 is defined. The isolation region 12 for example is formed by a shallow trench isolation (STI) process or a local oxidation of silicon (LOCOS) process, the latter being shown in the figure. The P-type substrate 11 also includes an N-type buried layer 14. The DMOS device is formed in the device region 100, which includes a gate 13, a drain 15, a source 16, a body 17, and a P-type high voltage well 18 besides the buried layer 14. The buried layer 14, the drain 15, the source 16, and the body 17 are formed by a lithography process and an ion implantation process, wherein the lithography process defines the implantation regions by a photoresist mask together with a self-alignment effect provided by all or part of the gate 13 and the isolation regions 12, and the ion implantation implants N-type impurities to the defined regions in the form of accelerated ions. The P-type high voltage well 18 is formed by a lithography process and an ion implantation process, wherein the lithography process defines the implantation regions by a photoresist mask, and the ion implantation process implants P-type impurities to the defined regions in the form of accelerated ions. A lightly doped region 20 is formed by a lithography process and an ion implantation process, wherein the lithography process defines the implantation regions by a photoresist mask together with a self-alignment effect provided by all or part of the gate 13, and the ion implantation process implants P-type impurities to the defined regions in the form of accelerated ions. The drain 15 and the source 16 are beneath the gate 13 and at different sides thereof respectively. Part of the gate 13 is above a field oxide region 22 in the DMOS device.

The DMOS device is a high voltage devices designed for applications requiring higher operation voltages. However, if it is required for the DMOS device to be integrated with a low voltage device in one substrate, the high voltage device and the low voltage device should adopt the same manufacturing process steps with the same ion implantation parameters, and thus the flexibility of the ion implantation parameters for the DMOS device is limited; as a result, the DMOS device will have a lower breakdown voltage and therefore a limited application range. To increase the breakdown voltage of the DMOS device, additional manufacturing process steps are required, that is, an additional lithography process and an additional ion implantation process are required in order to provide different ion implantation parameters, but this increases the cost.

In view of above, to overcome the drawbacks in the prior art, the present invention proposes a manufacturing method of a high voltage device which provides a higher breakdown voltage to the high voltage device so that the high voltage device may have a broader application range, in which additional manufacturing process steps are not required such that the high voltage device can be integrated with a low voltage device and manufactured by common manufacturing process steps.

SUMMARY OF THE INVENTION

An objective of the present invention is to provide a manufacturing method of a high voltage device.

To achieve the objectives mentioned above, from one perspective, the present invention provides a manufacturing method of a high device, including: providing a first conductive type substrate for forming the high voltage device and a low voltage device in the substrate, wherein the substrate has an upper surface; forming a second conductive type buried layer in the substrate beneath the upper surface; forming a first conductive type high voltage well between the upper surface and the buried layer from cross-section view, wherein the first conductive type high voltage well is formed by a first step in a process for forming the low voltage device, the first step being: (1) for forming a first conductive type well of the low voltage device; or (2) for forming a first conductive type channel stop layer of the low voltage device; and forming a second conductive type body beneath the upper surface by a second step in the process for forming the low voltage device, the second step being for forming a second conductive type well of the low voltage device, wherein the second conductive type body is adjacent to the high voltage well and located at a different horizontal position from the high voltage well.

In one embodiment, the first conductive type high voltage well is implanted through a mask that partially blocks the implanted area of the first conductive type high voltage well, such that the first conductive type high voltage well has a lower concentration than the first conductive type well of the low voltage device.

In one embodiment, the method further comprises forming a lightly doped region (LDD) in the second conductive type body by a third step in the process for forming the low voltage device, the third step being for forming (1) a second conductive type lightly doped drain (LDD) of the low voltage device, or (2) a second conductive type inverting layer of the low voltage device.

In another embodiment, the high voltage device preferably further includes a plurality of isolation regions formed in the substrate, by which the high voltage device is isolated from other devices, wherein the isolation region is a local oxidation of silicon (LOCOS) structure or a shallow trench isolation (STI) structure.

In yet another embodiment, the high voltage device is preferably a double diffused metal oxide semiconductor (DMOS) device.

In yet another embodiment, the third step is an ion implantation step for forming the second conductive type LDD of the low voltage device, wherein: when the second conductive type is N-type, the third step is performed by implanting phosphorus ions under accelerated voltage of 30,000-120,000 V and dosage of $2*10^{13}$-$6*10^{13}$ ions/cm$^2$; and when the second conductive type is P-type, the third step is performed by implanting boron ions under accelerated voltage of 10,000-100,000 V and dosage of $2*10^{13}$-$6*10^{13}$ ions/cm$^2$, or by implanting boron fluoride ions under accelerated voltage of 30,000-140,000 V and dosage of $2*10^{13}$-$6*10^{13}$ ions/cm$^2$.

In yet another embodiment, the third step is an ion implantation step for forming the second conductive type inverting layer of the low voltage device, wherein when the second conductive type is N-type, the third step is performed by implanting phosphorus ions under accelerated voltage of 30,000-80,000 V and dosage of $2*10^{12}$-$1*10^{13}$ ions/cm$^2$.

In yet another embodiment, the isolation region is the LOCOS structure, and the first step is an ion implantation step for forming a first conductive type well of the low voltage device, wherein when the first conductive type is P-type, the first step is performed by implanting boron ions under accelerated voltage of 50,000-200,000 V and dosage of: $5*10^{12}$-$1.5*10^{13}$ ions/cm$^2$; and the second step is performed by implanting phosphorus ions under accelerated voltage of 80,000-220,000 V and dosage of $5*10^{12}$-$5*10^{13}$ ions/cm$^2$; and when the first conductive type is N-type, the first step is performed by implanting phosphorus ions under accelerated voltage of 80,000-220,000 V and dosage of $5*10^{12}$-$5*10^{13}$ ions/cm$^2$; and the second step is performed by implanting boron ions under accelerated voltage of 50,000-200,000 V and dosage of $5*10^{12}$-$1.5*10^{13}$ ions/cm$^2$.

In yet another embodiment, the isolation region is the LOCOS structure, and the first step is an ion implantation step for forming a first conductive type channel stop layer of the low voltage device, wherein: when the first conductive type is P-type, the channel stop layer is formed by ion implantation process steps including: a fourth step implanting boron ions under accelerated voltage of 20,000-50,000 V and dosage of $2*10^{13}$-$6*10^{13}$ ions/cm$^2$; and a fifth step implanting boron ions under accelerated voltage of 120,000-22,000 V and dosage of $1*10^{12}$-$5*10^{12}$ ions/cm$^2$; and the second step is performed by implanting phosphorus ions under accelerated voltage of 80,000-220,000 V and dosage of $5*10^{12}$-$5*10^{13}$ ions/cm$^2$.

In yet another embodiment, the isolation region is the STI structure, and the first step is an ion implantation step for forming a first conductive type well of the low voltage device, wherein: when the first conductive type is P-type, the first step is performed by implanting boron ions under accelerated voltage of 30,000-500,000 V and dosage of $1*10^{13}$-$5*10^{13}$ ions/cm$^2$; and the second step is performed by implanting phosphorus ions under accelerated voltage of 40,000-800,000 V and dosage of $1*10^{13}$-$5*10^{13}$ ions/cm$^2$; and when the first conductive type is N-type, the first step is performed by implanting phosphorus ions under accelerated voltage of 40,000-800,000 V and dosage of $1*10^{13}$-$5*10^{13}$ ions/cm$^2$; and the second step is performed by implanting boron ions under accelerated voltage of 30,000-500,000 V and dosage of $1*10^{13}$-$5*10^{13}$ ions/cm$^2$.

The objectives, technical details, features, and effects of the present invention will be better understood with regard to the detailed description of the embodiments below.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1:
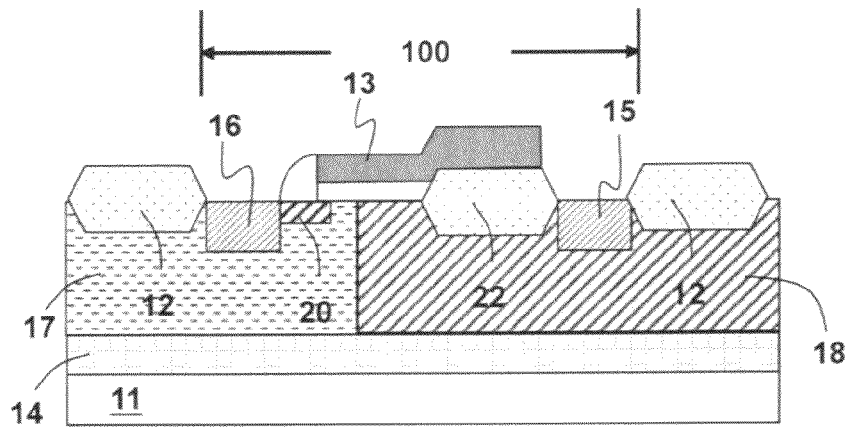
FIG. 1 shows a cross-section view of a conventional DMOS device.
Figure 2:
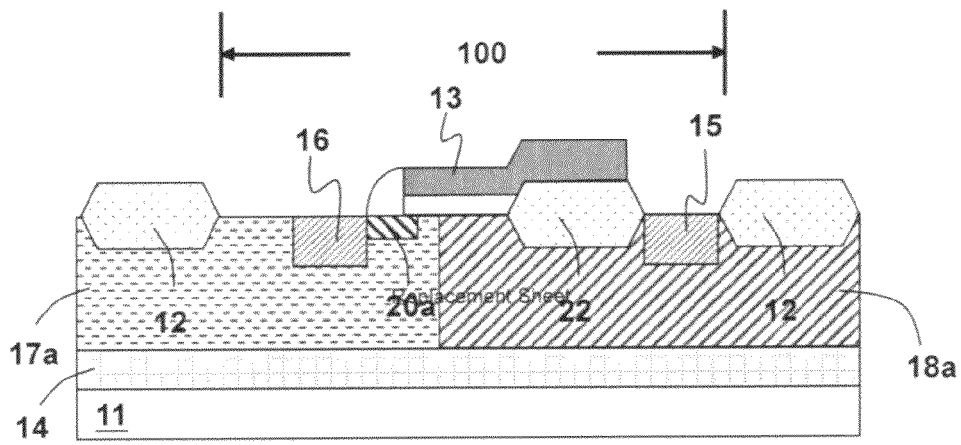
FIG. 2 shows a first embodiment of the present invention.
Figure 3:
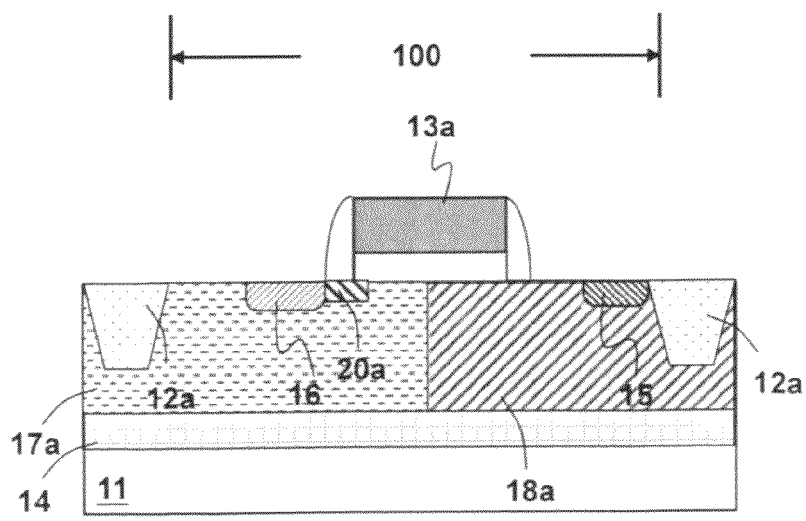
FIG. 3 shows a second embodiment of the present invention.

Please refer to FIG. 2 for a first embodiment according to the present invention, wherein a cross-section view of a high voltage DMOS device according to the present invention is illustrated in the figure. In a substrate 11, isolation regions 12 are formed to define a device region 100, wherein the substrate 11 is, for example but not limited to, a P-type substrate (or an N-type substrate in another embodiment), and the isolation regions 12 are formed, for example, by an STI or LOCOS process (the latter being shown in the figure). And as shown in FIG. 2, the substrate 11 includes an N-type buried layer 14, which has a different conductive type from the substrate 11. Further, as shown in FIG. 2, an N-type body 17a and a P-type well 18a are formed in the substrate 11, wherein the N-type body 17a is formed between the upper surface of the substrate 11 and the buried layer 14 from the cross-section view. The P-type high voltage well 18a is formed beneath the upper surface of the substrate 11. The N-type body 17a is adjacent to the P-type well 18a and located at a different horizontal position from the P-type well 18a. A field oxide region 22 is formed in the device region 100, wherein the field oxide region 22 is formed, for example, by an STI or LOCOS process, and it is preferably but not limited to being formed by the same process steps as the isolation regions 12. The device preferably includes a lightly doped region 20a which is formed by a lithography process and an ion implantation process, wherein the lithography process defines the implantation regions by a photoresist mask together with a self-alignment effect provided by all or part of the gate 13, and the ion implantation process implants P-type impurities to the defined regions in the form of accelerated ions. As shown in FIG. 3, a gate 13, drain 15, and source 16 are formed in the device region 100, wherein the source 16 and drain 15 are, for example but not limited to N-type, and are formed at two sides of the gate 13 in the device region 100 respectively, separated by the gate 13 and the field oxide region 22 from top view (not shown). A low voltage device is also formed in the substrate 11 (not shown). Note that what is described is an NMOS device as an example; the high voltage DMOS device may be a PMOS device, and in this case the conductivities of the doped regions should be reversed, that is, the P-type regions should be replaced by N-type regions and the N-type regions should be replaced by P-type regions.

This embodiment is different from the prior art in that, first, the P-type high voltage well 18a in this embodiment is formed by a process step for forming the low voltage device. This step may be: (1) a step for forming a P-type well (or an N-type well if the high voltage well 18a is N-type) of the low voltage device, wherein the well may have intermittent distribution of impurities; or (2) a step for forming a P-type channel stop layer (or an N-type channel stop layer if the high voltage well 18a is N-type) of the low voltage device. Second, the N-type body 17a is also formed by a process step for forming the low voltage device, and the step may be a step for forming an N-type well of the low voltage device. If the body 17A is P-type, it can be a P-type substrate or formed by a step for forming a P-type well of the low voltage device.

In a preferred embodiment, the lightly doped region 20a may be formed by a process step for forming (1) an N-type lightly doped drain (LDD) (or a P-type LDD in another embodiment) of the low voltage device, or (2) an N-type inverting layer of the low voltage device.

the present invention has the following advantage: in manufacturing process, no additional process step or mask is required, that is, the high voltage device can simply be formed by using the same process steps of the low voltage device in the same substrate 11. As such, the high voltage device of the present invention can be manufactured by a low cost.

FIG. 3 shows a second embodiment of the present invention. This embodiment is different from the first embodiment in that, in this embodiment, the gate 13a is completely located on the upper surface of the substrate 11, unlike the first embodiment wherein the gate 13a is partially above the field oxide region 22 from cross-section view; and, the isolation regions 12a of this embodiment are STI structures.

Figure 4A:
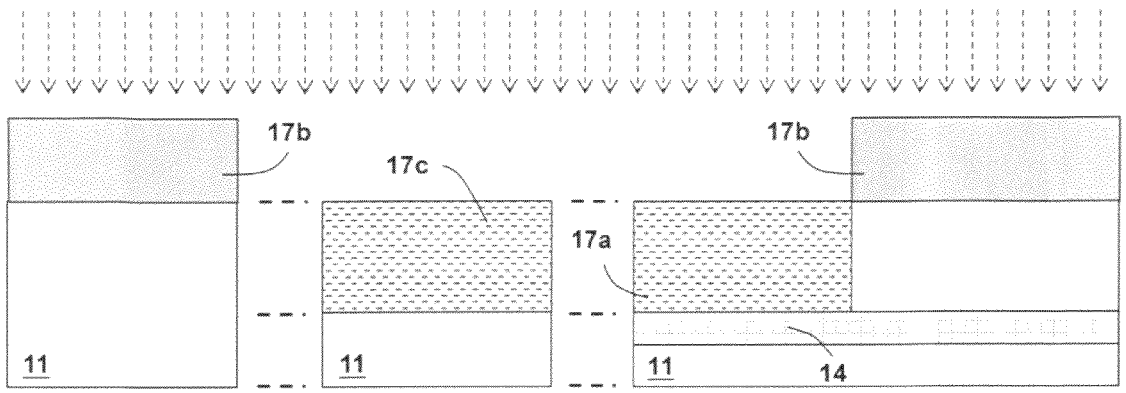
FIGS. 4A-4D show an embodiment of a manufacturing method of a high voltage device according to the present invention.

FIGS. 4A-4D show, by way of example, a manufacturing method of a high voltage device of the present invention, wherein the high voltage device is manufactured by process for manufacturing a low voltage device. For better understanding, it is assumed that a low voltage NMOS device, a low voltage PMOS device, and a high voltage NMOS device of the present invention are to be manufactured on the same substrate, which are shown from left to right in each figure of FIGS. 4A-4D, and separated by horizontal dashed lines. As shown in FIG. 4A, a P-type substrate 11 is provided, which has an upper surface and an N-type buried layer 14 is formed inside. As shown in the figure, in the P-type substrate 11, an N-type well 17c of the low voltage PMOS device and the N-type body 17a of the high voltage device are formed by common process steps, wherein a lithography process defines the implantation regions by for example but not limited to a photoresist mask 17b, and an ion implantation process implants N-type impurities to the defined regions in the form of accelerated ions as indicated by the dashed arrow lines.

Figure 4B:
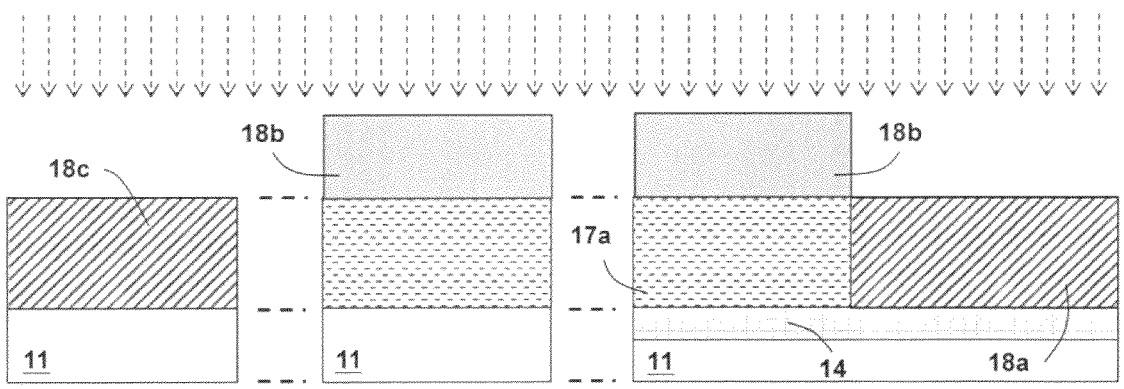

Referring to FIG. 4B, a P-type well 18c of the low voltage NMOS device and the P-type high voltage well 18a of the high voltage device are formed by common process steps, wherein a lithography process defines the implantation regions by for example but not limited to a photoresist mask 18b, and an ion implantation process implants P-type impurities to the defined regions in the form of accelerated ions as indicated by the dashed arrow lines. The N-type body 17a of the high voltage device is formed between the upper surface and the N-type buried layer 14 in the substrate 11 from cross-section view, and is adjacent to the P-type high voltage well 18a and located at a different horizontal position from the P-type high voltage well 18a.

Figure 4C:
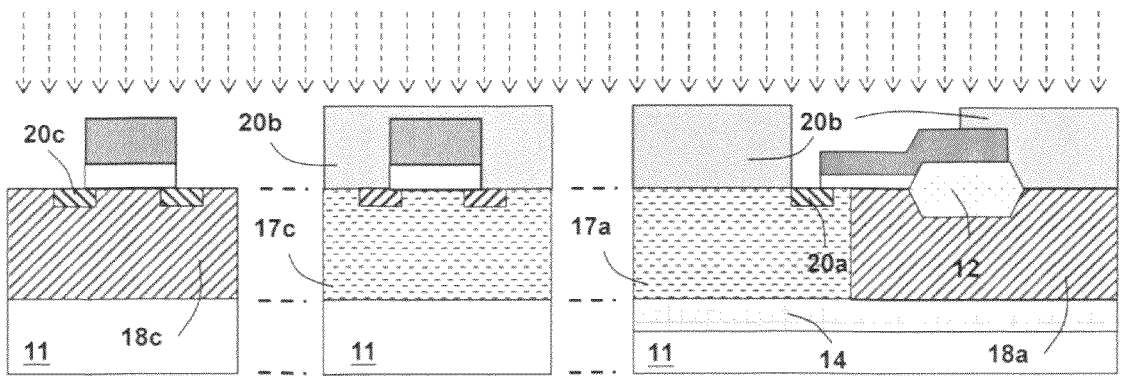

In the substrate 11, isolation regions 12 are formed to define a device region 100 (not shown), and as shown in FIG. 4C, the field oxide region 22 is formed by for example but not limited to the same process step for forming the isolation regions 12. The gate 13 without spacer portion is formed on the substrate 11, which is used as a mask for the lightly doped drain 20a. As shown in FIG. 4C, a P-type LDD of the low voltage PMOS device is formed, an N-type LDD 20c of the low voltage NMOS device and the N-type lightly doped region 20a of the high voltage device are formed by common process steps, wherein a lithography process defines the implantation regions by for example but not limited to a photoresist mask 20b, and an ion implantation process implants N-type impurities to the defined regions in the form of accelerated ions as indicated by the dashed arrow lines. In the above embodiment, the lightly doped region 20a of the high voltage device is formed by the same process step which forms the N-type LDD 20c of the low voltage NMOS device. In another embodiment, the lightly doped region 20a may be formed by the same process step for forming an N-type inverting layer of the low voltage device. More specifically, the N-type inverting layer is a layer inverting an enhancement type low voltage NMOS device to a depletion type low voltage NMOS device, which is formed by an ion implantation process. In one embodiment, the ion implantation process of the inverting layer can be performed by implanting phosphorus ions under accelerated voltage of 30,000-80,000 V and dosage of $2*10^{12}$-$1*10^{13}$ ions/cm$^2$.

Figure 4D:
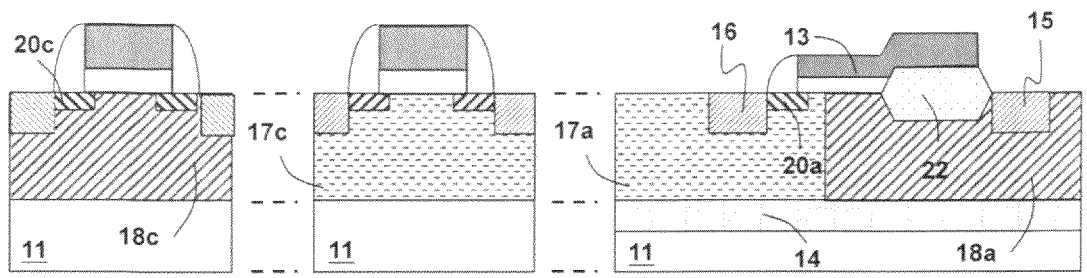

FIG. 4D shows that the gate 13, the drain 15, and the source 16 are formed in the device region 100, wherein the drain 15 and the source 16 are beneath the gate 13 and at different sides thereof respectively, separated by the gate 13 and the field oxide region 22. The high voltage device is completed. Note that under the same spirit, that is, to form the high voltage, device by the same process steps for forming a low voltage device, a PMOS high voltage device can be formed with similar process steps with proper modifications to the dopant conductivities.

Figure 5A:
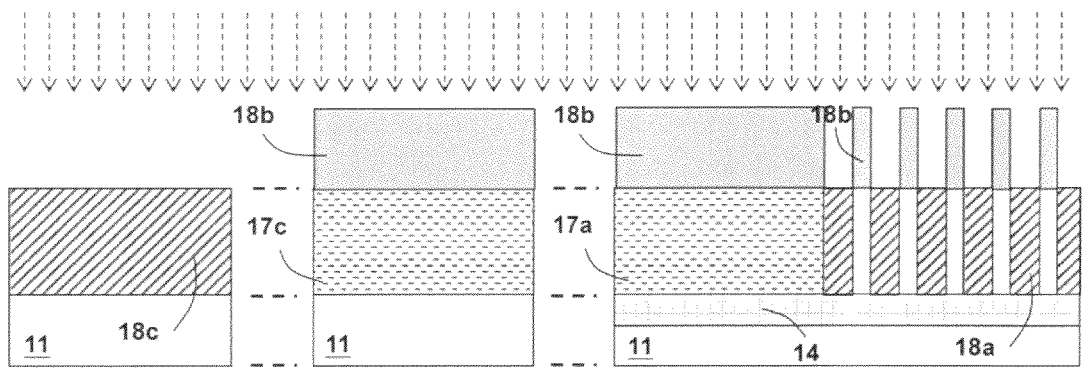
FIGS. 5A and 5B show another embodiment of forming a P-type high voltage well 18a of the high voltage device according to the present invention.
Figure 5B:
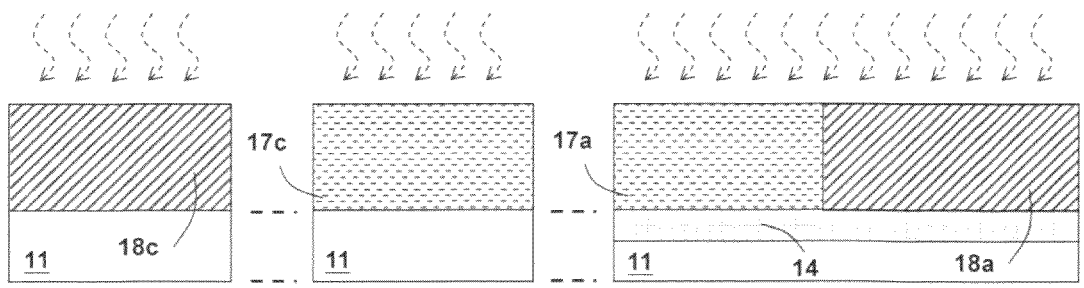

FIGS. 5A-5B show another embodiment of the P-type high voltage well 18a. As shown in FIG. 5A, a P-type well 18c of the low voltage NMOS device and the P-type high voltage well 18a of the high voltage device are formed by common process steps, wherein a lithography process defines the implantation regions by for example but not. limited to the photoresist mask 18b, and an ion implantation implants P-type impurities to the defined regions in the form of accelerated ions as indicated by the dashed arrow lines. This embodiment is different from the aforementioned embodiment in that, the photoresist mask 18b of this embodiment partially blocks the area of the P-type high voltage well 18a, for example by a pattern of bars, grids or dots, such that the P-type high voltage well 18a has impurities with intermittent distribution after the ion implantation process step, as shown in FIG. 5A. After a high temperature process that follows, the impurities will diffuse, for example as shown in FIG. 5B. Thus, the P-type high voltage well 18a will have a lower concentration than the P-type well of the low voltage NMOS device. Note that the impurities do not need to be distributed uniformly, nor do they need to become one region. The non-uniformly distributed impurities are even better because they may sustain higher operation voltage.

Instead of forming the P-type high voltage well 18a of the high voltage device by the process step for forming the P-type well 18c of the low voltage device, the P-type high voltage well 18a may be formed by the same process step for forming a P-type channel stop layer (not shown) of the low voltage device. The P-type channel stop layer is used for enhancing the electrical isolation of the isolation regions 12, which is well known by those skilled in the art, so details thereof are omitted here.

In all the aforementioned embodiments, although the lightly doped region 20a is shown, the high voltage device may include or omit the lightly doped region 20a according to applications and designs of the high voltage device. Where the high voltage device include the lightly doped region 20a, preferred parameters of the ion implantation process step for the lightly doped region 20a are for example as below:

(1) When the lightly doped region 20a is formed by the process step for forming the N-type LDD 20c of the low voltage NMOS device, preferred parameters of the ion implantation process step are: ions: phosphorus ions; accelerated voltage: 30,000-120,000 V; and dosage: $2*10^{13}$-$6*10^{13}$ ions/cm$^2$.

(2) When the lightly doped region 20a is formed by the process step for forming the P-type LDD of the low voltage NMOS device, one set of preferred parameters of the ion implantation process step are: ions: boron ions; accelerated voltage: 10,000-100,000 V; and dosage: $2*10^{13}$-$6*10^{13}$ ions/cm$^2$. Another set of preferred parameters of the ion implantation process step are: ions: boron fluoride ions; accelerated voltage: 30,000-140,000 V; and dosage: $2*10^{13}$-$6*10^{13}$ ions/cm$^2$.

(3) When the lightly doped region 20a is formed by the process step of the N-type inverting layer of the low voltage NMOS device, preferred parameters of the ion implantation process step of the N-type inverting layer are: ions: phosphorus ions; accelerated voltage: 30,000-80,000 V; and dosage: $2*10^{12}$-$1*10^{13}$ ions/cm$^2$.

In all the aforementioned embodiments, when the isolation region 12 is the LOCOS structure, and if the P-type high voltage well 18a of the high voltage device is formed by the same process step for forming the P-type well 18c of the low voltage device, preferred parameters of the ion implantation process step of the P-type well 18c of the low voltage NMOS device are: ions: boron ions; accelerated voltage: 50,000-200,000 V; dosage: $5*10^{12}$-$1.5*10^{13}$ ions/cm$^2$. And if the P-type high voltage well 18a of the high voltage device is formed by the same process step for forming the P-type channel stop layer of the low voltage device, the P-type channel stop layer is preferably formed by two ion implantation process steps, with the following parameters: first step: ions: boron ions; accelerated voltage: 20,000-50,000 V; and dosage: $2*10^{13}$-$6*10^{13}$ ions/cm$^2$; and second step: ions: boron ions; accelerated voltage: 120,000-22,000 V; and dosage: $1*10^{12}$-$5*10^{12}$ ions/cm$^2$. When the isolation region 12 is the LOCOS structure, preferred parameters of the ion implantation step for forming the N-type well 17c of the low voltage PMOS device are: ions: phosphorus ions; accelerated voltage: 80,000-220,000 V; and dosage: $5*10^{12}$-$5*10^{13}$ ions/cm$^2$.

On the other hand, when the isolation region is the STI structure, and if the P-type high voltage well 18a of the high voltage device is formed by the same process step for forming the P-type well 18c of the low voltage device, preferred parameters of the ion implantation process step of the P-type well 18c of the low voltage NMOS device are: ions: boron ions; accelerated voltage: 30,000-500,000 V; and dosage: $1*10^{13}$-$5*10^{13}$ ions/cm$^2$. And preferred parameters of the ion implantation process step for forming the N-type well 17c of the low voltage PMOS device are: ions: phosphorus ions; accelerated voltage: 40,000-800,000 V; and dosage: $1*10^{13}$-$5*10^{13}$ ions/cm$^2$.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristics of the device, such as a deep well, etc., can be added. For another example, the lithography step described in the above can be replaced by electron beam lithography, X-ray lithography, etc. In view of the foregoing, the spirit of the present invention should cover all such and other modifications and variations, which should be interpreted to fall within the scope of the following claims and their equivalents.

What is claimed is:

1. A manufacturing method of a high voltage device, comprising:
    providing a first conductive type substrate for forming the high voltage device and a low voltage device in the substrate, wherein the substrate has an upper surface;
    forming a second conductive type buried layer in the substrate beneath the upper surface;
    forming a first conductive type high voltage well between the upper surface and the buried layer from cross-section view, wherein the first conductive type high voltage well is formed by a first step in a process for forming the low voltage device, the first step being for forming a first conductive type well of the low voltage device, and the first conductive type high voltage well has a lower concentration than the first conductive type well of the low voltage device by partially blocking an area of the first conductive type high voltage well in an implantation process; and
    forming a second conductive type body beneath the upper surface by a second step in the process for forming the low voltage device, the second step being for forming a second conductive type well of the low voltage device, wherein the second conductive type body is adjacent to the high voltage well and located at a different horizontal position from the high voltage well.

2. The manufacturing method of claim 1, further comprising forming a plurality of isolation regions in the substrate to isolate the high voltage device from other devices, and wherein the isolation region is a local oxidation of silicon (LOCOS) structure or a shallow trench isolation (STI) structure.

3. The manufacturing method of claim 2, wherein the isolation region is the LOCOS structure, and the first step is an ion implantation step for forming a first conductive type well of the low voltage device, wherein the first conductive type is P-type, and the first step is performed by implanting boron ions under accelerated voltage of 50,000-200,000 V and dosage of: $5*10^{12}$-$1.5*10^{13}$ ions/cm$^2$; and
    the second step is performed by implanting phosphorus ions under accelerated voltage of 80,000-220,000 V and dosage of $5*10^{12}$-$5*10^{13}$ ions/cm$^2$.

4. The manufacturing method of claim 2, wherein the isolation region is the STI structure, and the first step is an ion implantation step for forming a first conductive type well of the low voltage device, wherein
    the first conductive type is P-type, and the first step is performed by implanting boron ions under accelerated voltage of 30,000-500,000 V and dosage of $1*10^{13}$-$5*10^{13}$ ions/cm$^2$; and
    the second step is performed by implanting phosphorus ions under accelerated voltage of 40,000-800,000 V and dosage of $1*10^{13}$-$5*10^{13}$ ions/cm$^2$.

5. The manufacturing method of claim 2, wherein the isolation region is the LOCOS structure, and the first step is an ion implantation step for forming a. first conductive type well of the low voltage device, wherein the first conductive type is N-type, and the first step is performed by implanting phosphorus ions under accelerated voltage of 80,000-220,000 V and dosage of $5*1012$-$5*1013$ ions/cm2; and the second step is performed by implanting boron ions under accelerated voltage of 50,000-200,000 V and dosage of $5*1012$-$1.5*1013$ ions/cm2.

6. The manufacturing method of claim 2, wherein the isolation region is the STI structure, and the first step is an ion implantation step for forming a first conductive type well of the low voltage device, wherein the first conductive type is N-type, the first step is performed by implanting phosphorus ions under accelerated voltage of 40,000-800,000 V and dosage of $1*1013$-$5*1013$ ions/cm2; and the second step is performed by implanting boron ions under accelerated voltage of 30,000-500,000 V and dosage of $1*1013$-$5*1013$ ions/cm2.

7. The manufacturing method of claim 1, wherein the high voltage device is a double diffused metal oxide semiconductor (DMOS) device.

8. A manufacturing method of a high voltage device, comprising:
    providing a first conductive type substrate for forming the high voltage device and a low voltage device in the substrate, wherein the substrate has an upper surface;

forming a second conductive type buried layer in the substrate beneath the upper surface;

forming a first conductive type high voltage well between the upper surface and the buried layer from cross-section view, wherein the first conductive type high voltage well is formed by a first step in a process for forming the low voltage device, the first step being for forming a first conductive type well of the low voltage device;

forming a second conductive type body beneath the upper surface by a second step in the process for forming the low voltage device, the second step being for forming a second conductive type well of the low voltage device, wherein the second conductive type body is adjacent to the high voltage well and located at a different horizontal position from the high voltage well; and forming a lightly doped region (LDD) in the second conductive type body by a third step in the process for forming the low voltage device, the third step being for forming (1) a second conductive type lightly doped drain (LDD) of the low voltage device, or (2) a second conductive type inverting layer of the low voltage device.

9. The manufacturing method of claim 8, wherein the third step is an ion implantation step for forming the second conductive type LDD of the low voltage device, wherein the second conductive type is N-type, and the third step is performed by implanting phosphorus ions under accelerated voltage of 30,000-120,000 V and dosage of $2*10^{13}$-$6*10^{13}$ ions/cm$^2$.

10. The manufacturing method of claim 8, wherein the third step is an ion implantation step for forming the second conductive type inverting layer of the low voltage device, wherein the second conductive type is N-type, and the third step is performed by implanting phosphorus ions under accelerated voltage of 30,000-80,000 V and dosage of $2*10^{12}$-$1*10^{13}$ ions/cm$^2$.

11. The manufacturing method of claim 8, wherein the third step is an ion implantation step for forming the second conductive type LDA of the low voltage device, wherein the second conductive type is P-type, and the third step is performed by implanting boron ions under accelerated voltage of 10,000-100,000V and dosage of $2*10^{13}$-$6*10^{13}$ ions/cm$^2$, or by implanting boron fluoride ions under accelerated voltage of 30,000-140,000V and dosage of $2*10^{13}$-$6*10^{13}$ ions/cm$^2$.

* * * * *